United States Patent [19]

Smith

[11] Patent Number: 4,602,166

[45] Date of Patent: Jul. 22, 1986

[54] TRANSFORMER DRIVING NETWORK WITH PRIMARY CURRENT LIMITING MEANS

[76] Inventor: Steve Smith, 5100 Channel Ave., Richmond, Calif. 94804

[21] Appl. No.: 495,971

[22] Filed: May 19, 1983

[51] Int. Cl.⁴ .................... H03K 3/45; H03K 3/49; H03K 3/01; H03B 1/04

[52] U.S. Cl. .................... 307/314; 307/270; 307/549; 307/542

[58] Field of Search ............... 307/282, 314, 542, 549, 307/558, 560, 564, 270; 361/31, 38, 93, 35, 36; 363/49

[56] References Cited

U.S. PATENT DOCUMENTS

| | | | |
|---|---|---|---|
| 3,181,071 | 4/1965 | Smith et al. ..................... | 307/314 |
| 3,196,340 | 7/1965 | Genuit ............................. | 307/314 |
| 3,377,518 | 4/1968 | Radcliffe ........................ | 307/282 |
| 4,403,269 | 9/1983 | Carroll ........................... | 307/542 |

Primary Examiner—Stanley D. Miller
Assistant Examiner—Timothy P. Callahan
Attorney, Agent, or Firm—Thomas E. Schatzel

[57] ABSTRACT

A non-linear network is disclosed for use in a power processor (converter) for limiting transformer primary winding current during (switching) transitions of a transformer driving potential, the network employing a resistor for coupling a suitably limited current from the potential to the winding and a saturable reactor connected in parallel with the resistor, the reactor for bypassing the resistor except during (and until a suitable period after) transitions of the potential level.

5 Claims, 6 Drawing Figures

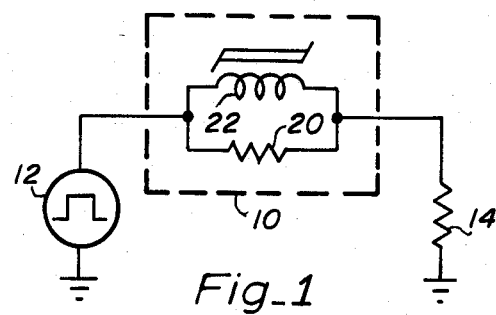
Fig_1
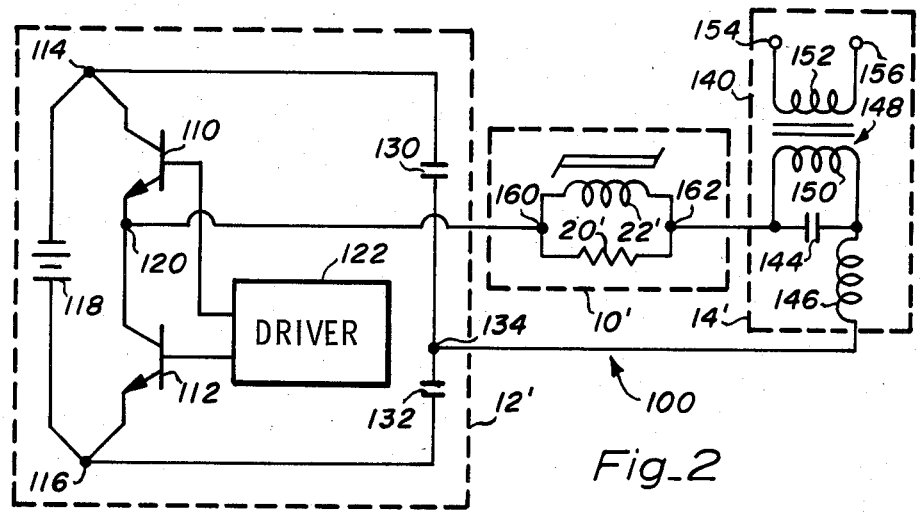
Fig_2
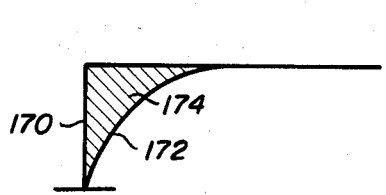
Fig_3
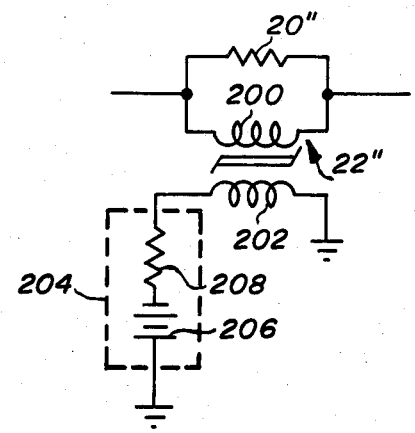
Fig_4

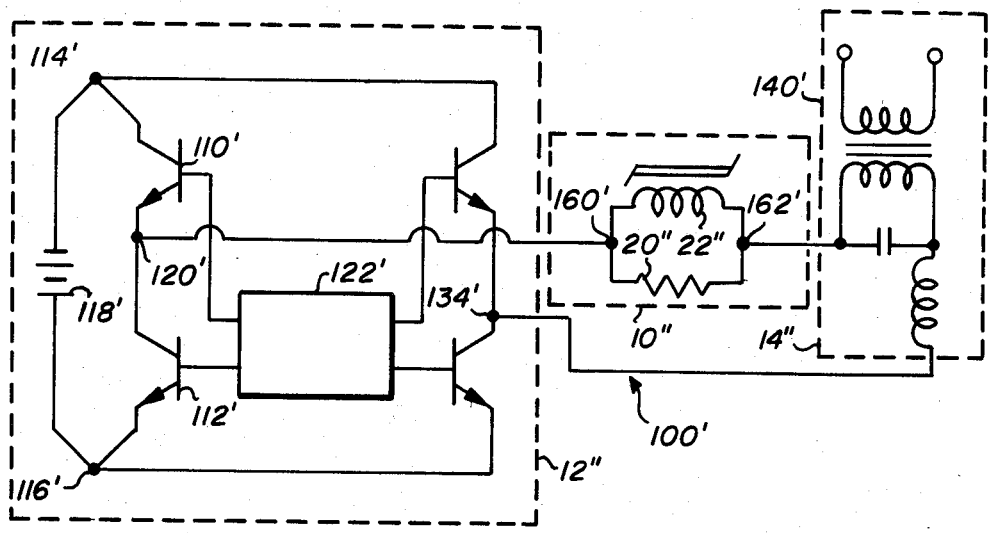
Fig_5
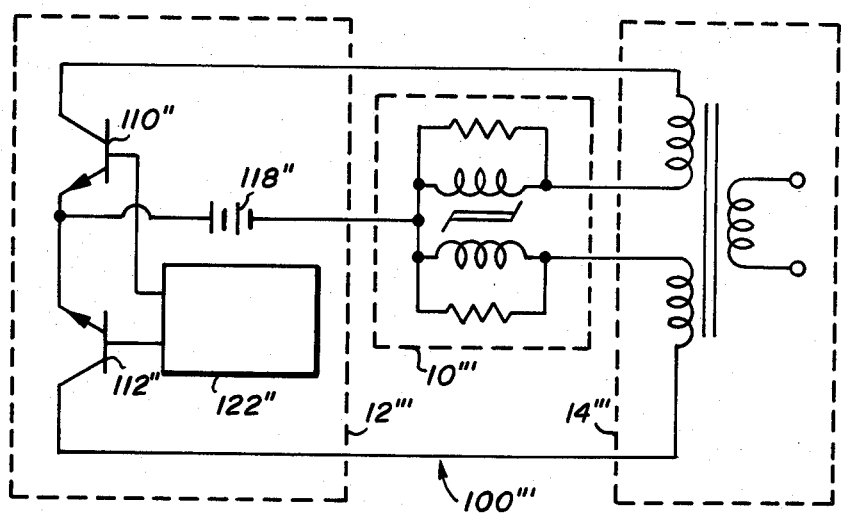
Fig_6

TRANSFORMER DRIVING NETWORK WITH PRIMARY CURRENT LIMITING MEANS

BACKGROUND OF THE INVENTION

1. Field of the Invention

The present invention relates to power processors (converters) generally and more specifically to a non-linear coupling network for use therein, the network for limiting transformer primary winding current during (switching) transitions of a transformer driving potential.

2. Description of the Prior Art

The shunt (winding) capacitance and series (leakage) inductance associated with a transformer present a number of problems, particularly when the transformer is driven by a pulse (or other excitation) having a fast rise and/or fall time. Consider, for example, the related power-processing (converting) circuit configurations which are commonly referred to as half-bridge, full-bridge and push-pull. In the half-bridge circuit configuration, one end of the primary winding of a transformer is connected to the juncture of a pair of voltage-divider capacitors which are connected in series between a pair of terminals for connection to a voltage source, the capacitors for establishing the (capacitor) winding end at the voltage-source-mean potential. The other transformer primary winding end is connected to the juncture of a pair of transistors connected as switches in series between the voltage source terminals. The transistors are driven, in turn, so as to, alternately, couple the (transistor) winding end to each of the voltage source terminals.

The full-bridge circuit configuration employs transistor switches in place of the capacitors of the half-bridge circuit configuration. More specifically, in the full-bridge circuit configuration, one end of the primary winding of a transformer is connected to the juncture of a pair of transistors connected as switches in series between a pair of terminals for connection to a voltage source. The other transformer primary winding is connected to the juncture of another pair of transistors which are also connected as switches in series between the voltage source terminals. The transistors are driven so as to couple the primary winding, in alternate orientations, across the voltage source.

The push-pull circuit configuration employs a center tapped transformer primary winding rather than the capacitors of the half-bridge circuit configuration. Specifically, in the push-pull circuit configuration, a pair of transistors are connected as switches in series between the distal ends of the primary winding of a transformer. The juncture of the transistor switches and the center tap of the primary winding are connected each to a respective one of a pair of terminals for connection to a voltage source. The transistors are driven, in turn, so as to, alternately, couple the voltage source across each of the two transformer primary winding halves.

In each of the above-mentioned power processing (converting) circuit configurations, a transformer is driven by a potential which varies as a series of (alternating polarity) pulses or a square wave. With each change in the transformer driving potential level, the transformer shunt (winding) capacitance is charged/discharged storing/delivering energy. Unfortunately, especially to the extent that the transformer capacitance is charged/discharged during the transistor switching periods, a significant portion of the energy is dissipated in the transistors limiting the performance of the power processor.

Additionally, the combination of the transformer shunt (winding) capacitance and series (leakage) inductance acts as a low-pass filter limiting the response time of the transformer. When the transformer is driven by a pulse having a rise and/or fall time less than that which the transformer can reproduce and when the transformer is not loaded by an impedance equal to or less than the filter characteristic impedance (given by the square root of the leakage inductance over shunt capacitance quotient), a voltage which rings at the (leakage-inductance-shunt-capacitance) resonant frequency is developed across the transformer secondary. In power-processing applications in which the voltage developed across the transformer secondary winding is rectified and filtered by a filter capacitor, the voltage developed across the filter capacitor varies. When lightly loaded, the filter capacitor tends to charge to a potential which approaches the peak (crest) ringing potential. Not only does the power-processor regulation suffer as a result of the peak charging, but the peak potential may prove destructive.

To stabilize the voltage developed across the filter capacitor, it is common practice to employ a bleeder resistor connected across the filter capacitor. Unfortunately, to properly stabilize the voltage developed across the filter capacitor, it is necessary to employ a bleeder resistor having a relatively low resistance. As a consequence, the bleeder resistor dissipates (wastes) a significant amount of power.

A resistor having a suitable resistance may be employed interposed in series with the transformer primary winding to reduce or eliminate ringing and to delay transformer capacitance charging. In addition to limiting the peak transformer capacitance charging current, such a resistor also tends to limit the peak filter capacitance charging current. Unfortunately, to be effective, a relatively large resistance must be employed. As a consequence, a normally intolerable voltage drop is developed across the resistor by the transformer magnitization and/or load current. Further, the power dissipated by the resistor reduces (to often unacceptable levels) the power-processor efficiency.

SUMMARY OF THE PRESENT INVENTION

It is therefore a primary object of the present invention to provide a means for limiting power-processor (converter) transformer current during power-processor transistor switching transitions.

Another primary object of the present invention is to provide a means for minimizing transformer ringing.

Briefly, the preferred embodiment of the present invention employs a resistor for coupling a suitably limited current from a driving potential to a load and a saturable reactor connected in parallel with the resistor, the reactor for bypassing the resistor except during (and until a suitable period after) transitions of the potential level.

An advantage of the present invention is the ability it affords to couple a driving potential to a load while limiting the current during potential level transitions.

Another advantage of the present invention is the ability it affords to increase the efficiency and regulation of power processors.

These and other objects and advantages of the present invention will no doubt become apparent to those skilled in the art after having read the following detailed description of the preferred embodiments which are illustrated in the several figures of the drawing.

IN THE DRAWING

FIG. 1 is a schematic diagram illustrating a nonlinear coupling network in accordance with the present invention;

FIG. 2 is a schematic diagram illustrating a power-processing (converting) circuit of the half-bridge configuration employing the network shown in FIG. 1;

FIG. 3 is a pair of waveforms of potential differences developed by the circuit shown in FIG. 2;

FIG. 4 is a schematic diagram illustrating an alternative embodiment of a non-linear coupling network in accordance with the present invention;

FIG. 5 is a schematic diagram illustrating a power-processing (converting) circuit of the full-bridge configuration employing the network shown in FIG. 1; and FIG. 6 is a schematic diagram illustrating a power-processing (converting) circuit of the push-pull configuration employing the network shown in FIG. 1.

DETAILED DESCRIPTION OF THE PREFERRED EMBODIMENTS

The preferred embodiment of a non-linear coupling network in accordance with the present invention is illustrated in FIG. 1 of the drawing generally designated by the number 10, the network for coupling a driving potential, represented by a generator 12, to a load, represented by an impedance 14. Network 10 employs a resistor 20 connected between the driving potential (generator 12) and the load (impedance 14) and a saturable reactor (inductor) 22 connected in parallel with resistor 20. Resistor 20 has a resistance chosen to limit (or further limit) to a desired level the load current conducted during potential level transitions. Saturable reactor 22 has a winding and core chosen to provide a suitable volt-second support so as to force the load current conducted during potential level transitions (and for a desired period thereafter) to flow through resistor 20, and, thereafter, to conduct the load current around the resistor.

As an example to further clarify the manner and process of making and using the present invention, a power processing (converting) circuit of the half-bridge configuration is shown in FIG. 2 employing a non-linear coupling network in accordance with the present invention, the network being designated 10'. (Although a half-bridge circuit configuration is shown, the following disclosure applies as well to the other power processing circuit configurations including full-bridge and push-pull and to pulse circuits.) The power processing circuit, which is generally designated 100, is shown to employ a pair of transistors 110 and 112 connected as switches in series between a pair of nodes (terminals) 114 and 116 for connection to a voltage source, represented by a battery 118. More specifically, transistor 110 has an emitter connected to a node 120, a base, and a collector connected to node 114; and, transistor 112 has an emitter connected to node 116, a base, and a collector connected to node 120. The bases of transistors 110 and 112 are connected to a driver 122 which is of suitable configuration to, alternately, drive the transistors into saturation coupling node 120 (at the transistor junction) to each of voltage source nodes (terminals) 114 and 116.

Power processing circuit 100 also employs a pair of voltage-divider capacitors 130 and 132 connected in series between voltage source nodes (terminals) 114 and 116, capacitor 130 being connected between node 114 and a node 134 and capacitor 132 being connected between node 134 and node 116. Capacitors 130 and 132 are of suitable capacity to maintain node 134 at a potential approximately the mean of the potentials at nodes 114 and 116.

Also employed in power processing circuit 100 is a transformer 140 (also designated 14') and a non-linear coupling network (designated 10') in accordance with the present invention. The primary winding of transformer 140 and network 10' are connected in series between nodes 120 and 134. For clarity, transformer 140 is modeled by a capacitor 144 representing the transformer shunt (winding) capacitance; an inductor 146 representing the transformer series (leakage) inductance connected in series with network 10' and capacitor 144 between nodes 120 and 134; and an "ideal transformer" 148 having a primary winding 150 connected in parallel with capacitor 144 and a secondary winding 152 connected between a pair of terminals 154 and 156. Of course, capacitor 144, inductor 146 and "ideal transformer" 148 represent characteristics of a "real transformer" (transformer 140). Obviously, a "real transformer" (transformer 140) is connected so that the transformer primary winding is connected in series with network 10' between nodes 120 and 134 and the transformer secondary winding is connected between points 154 and 156.

Network 10' includes a resistor (designated 20') connected in series with the primary winding of transformer 140 between nodes 120 and 134 and a saturable reactor (designated 22') connected in parallel with resistor 20' (between a pair of nodes 160 and 162, the former being connected to node 120). Resistor 20' has a resistance selected to meet some criteria, such as, for example, reduce, or minimize, the power dissipated in transistors 110 and 112 and/or to (in combination with other circuit resistances) damp (or critically damp) the voltage developed across the transformer secondary winding, between points 154 and 156.

Saturable reactor 22' has a winding and core chosen to provide a volt-second support so as to force the network 10 current conducted during potential level transitions and during a desired period thereafter to flow through resistor 20' and, thereafter, to conduct the current around the resistor.

With additional reference to FIG. 3, a waveform representation of the transition of the potential difference developed between nodes 120 and 134 is shown designated 170. Also shown is a waveform, designated 172, representing the potential difference developed across the primary winding of transformer 140, between nodes 162 and 134, responsive to the signal designated 170 when saturable reactor 22' is disconnected. A preferred reactor 22' winding and core combination provides a volt-second support approximately equal to the area designated 174. When a saturable reactor having a lesser volt-second support is employed (one having less turns on the same core), the reactor saturates earlier and, as a consequence, conducts an impulse around resistor 20' causing ringing. On the other hand, when a saturable reactor having a greater volt-second support is employed (one having more turns), the reactor saturates later causing additional power to be dissipated in resistor 20'. For power processors (converters) employing a 100 kHz square wave potential having an input rise time of less than 100 nanoseconds and an unloaded damped rise time of several hundred nanoseconds, it has been found that a ¼ mil alloy thickness provides reasonably low core loss for most applications.

It is common practice in power-processor (converter) circuits to employ (as appropriate) a DC blocking capacitor in series with the transformer primary winding to prevent the flow of a net DC current through the winding (such as is generated by minor component variations and imbalances). Absent a net DC current flow through the saturable reactor (designated 20 in FIG. 1 and designated 20' in FIG. 2), the current flow through the saturable reactor during each half-cycle resets the core for the next, opposite, half-cycle.

In circuits (such as some pulse circuits) in which a net DC current flows through the saturable reactor (20), the saturable reactor core should be (biased or) reset by other means, such as, for example, the use of a biasing current conducted through the saturable reactor winding or through another saturable reactor winding. The use of an additonal winding to reset the saturable reactor core is illustrated in FIG. 4. Specifically, a saturable reactor (designated 20") is illustrated having, in addition to the main winding (designated 200), an additional winding 202 connected to a current source 204. In this embodiment, the current source is illustrated as being developed by the series combination of the voltage source 206 and a current limiting resistor 208.

In the push-pull circuit configuration (FIG. 6), the transformer primary winding center tap should be split apart with each winding being individually coupled to the voltage source terminal by a respective one of two resistors each connected in parallel with a respective one of two saturable reactor windings. The two windings are wound on a common core in opposite directions so that the current flow through one winding during one half-cycle will reset the core for the next, opposite, half-cycle.

It is contemplated that after having read the preceding disclosure certain alterations and modifications of the present invention will no doubt become apparent to those skilled in the art. It is therefore intended that the following claims be interpreted to cover all such alterations and modifications as fall within the true spirit and scope of the invention.

I claim:

1. A power processor circuit for driving a transformer comprising:
   voltage source means having first and second terminals for providing a voltage therebetween;
   first switching means coupled between said first terminal of said voltage source means and a common node and having a control terminal;
   second switching means coupled between said second terminal of said voltage source means and said common node and having a control terminal;
   driver means coupled to the control terminals of said first and second switching means, said driver means driving said first and second switching means so as to alternately couple said common node to said first and second terminals of said voltage source means;
   transformer means having a primary and secondary winding, said primary winding having a pair of terminals;
   one terminal of said primary winding being coupled to said first voltage source terminal through a first voltage divider means and to said second voltage source terminal through a second voltage divider means;
   network means coupled between the other terminal of said primary winding and said common node, said network means including a resistor for limiting to a predetermined level the current conducted through said primary winding during transitions of said first and second switching means and a saturable reactor connected in parallel with said resistor, said saturable reactor for forcing said winding current to flow through said resistor during each of said switching transitions and bypassing said resistor a predetermined period thereafter.

2. A power processor circuit as recited in claim 1 wherein said first voltage divider means includes a first capacitor coupled between said one terminal of said primary winding and said first voltage source terminal and wherein said second voltage divider means includes a second capacitor coupled between said one terminal of said primary winding and said second voltage source terminal.

3. A power processor circuit as recited in claim 1 wherein said first voltage divider means includes third switching means coupled between said one terminal of said primary winding and said first voltage source terminal and having a control terminal, wherein said second voltage divider means includes fourth switching means coupled between said one terminal of said primary winding and said second voltage source terminal and having a control terminal, and wherein said driver means is additionally coupled to the control terminals of said third and fourth switching means, said driver means additionally driving said third and said fourth switching means so as to alternately couple said one terminal of said primary winding to said first and second terminals of said voltage source means.

4. A power processor circuit for driving a transformer comprising:
   voltage source means having first and second terminals for providing a voltage therebetween;
   transformer means having a first primary winding, a second primary winding, and a secondary winding, said first primary winding having first and second terminals and said second primary winding having first and second terminals;
   first switching means coupled between said first terminal of said voltage source means and said first terminal of said first primary winding and having a control terminal;
   second switching means coupled between said first terminal of said voltage means and said first terminal of said second primary winding and having a control terminal;
   driver means coupled to the control terminals of said first and second switching means, said driver means driving said first and second switching means so as to alternately couple said first terminal of said voltage source means to said first terminal of said first primary winding and said first terminal of said second primary winding;
   first network means coupled between said second terminal of said voltage source means and said second terminal of said first primary winding, said network means including a resistor for limiting to a predetermined level the current conducted through said first primary winding during transitions of said first and second switching means and a saturable reactor connected in parallel with said resistor, said saturable reactor for forcing said first primary winding current to flow through said resistor during each of said switching transitions and bypassing said resistor a predetermined period thereafter; and second network means coupled between said second terminal of said voltage source means and said second terminal of said second primary winding, said network means including a resistor for limiting to a predetermined level the current conducted through said second primary winding during transitions of said first and second switching means and a saturable reactor connected in parallel with said resistor, said saturable reactor for forcing said second primary winding current to flow through said resistor during each of said switching transitions and bypassing said resistor a predetermined period thereafter.

5. A power processor as recited in claim 4 wherein said saturable reactor of said first network means and said saturable reactor of said second network share a common core.

* * * * *